United States Patent
Zhou et al.

(10) Patent No.: US 9,830,890 B2
(45) Date of Patent: Nov. 28, 2017

(54) METHOD AND DEVICE FOR COMPRESSING AND DECOMPRESSING DATA INFORMATION, DRIVE COMPENSATION METHOD AND DEVICE, AND DISPLAY DEVICE

(71) Applicant: BOE TECHNOLOGY GROUP CO., LTD., Beijing (CN)

(72) Inventors: Yang Zhou, Beijing (CN); Song Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/515,349

(22) PCT Filed: Sep. 29, 2015

(86) PCT No.: PCT/CN2015/091008
§ 371 (c)(1),
(2) Date: Mar. 29, 2017

(87) PCT Pub. No.: WO2017/000404
PCT Pub. Date: Jan. 5, 2017

(65) Prior Publication Data
US 2017/0236498 A1    Aug. 17, 2017

(30) Foreign Application Priority Data
Jun. 30, 2015    (CN) .......................... 2015 1 0376917

(51) Int. Cl.
*G06T 9/00*    (2006.01)
*G09G 5/393*    (2006.01)
(Continued)

(52) U.S. Cl.
CPC ........... *G09G 5/393* (2013.01); *G09G 3/2092* (2013.01); *G09G 5/10* (2013.01); *H03M 7/30* (2013.01); *G09G 2320/0233* (2013.01)

(58) Field of Classification Search
CPC ............. G09G 2340/02; G09G 3/3406; G09G 2320/0233; G09G 2320/0295; G09G 2320/045; G06T 9/005
See application file for complete search history.

(56) References Cited

U.S. PATENT DOCUMENTS

| | | | |
|---|---|---|---|
| 5,619,591 A * | 4/1997 | Tsang | G06T 9/005 382/166 |
| 2009/0027410 A1 * | 1/2009 | Inuzuka | G09G 5/026 345/555 |
| 2014/0152690 A1 | 6/2014 | Yuda et al. | |

FOREIGN PATENT DOCUMENTS

| | | |
|---|---|---|
| CN | 103281537 A | 9/2013 |
| CN | 103795419 A | 5/2014 |
| CN | 104917534 A | 9/2015 |

OTHER PUBLICATIONS

Search Report and Written Opinion dated Apr. 1, 2016 from State Intellectual Property Office of the P.R. China.

* cited by examiner

*Primary Examiner* — Hau Nguyen
(74) *Attorney, Agent, or Firm* — Dilworth & Barrese, LLP.; Michael J. Musella, Esq.

(57) ABSTRACT

A method and device for compressing and decompressing data information, a drive compensation method and device, and a display device. The method for compressing data information includes: acquiring data information corresponding to a sub pixel unit; establishing a distribution function model according to the data information; obtaining a valid option value section according to the distribution
(Continued)

function model and a valid threshold value; and dividing the valid option value section into N compression sections, and compressing data information corresponding to each of the compression sections to M times of data information corresponding to all the sub pixel units according to a storage length P of the data information corresponding to the sub pixel unit to obtain N compressed data information blocks.

19 Claims, 14 Drawing Sheets

(51) Int. Cl.
  *H03M 7/30* (2006.01)
  *G09G 3/20* (2006.01)
  *G09G 5/10* (2006.01)

METHOD AND DEVICE FOR COMPRESSING AND DECOMPRESSING DATA INFORMATION, DRIVE COMPENSATION METHOD AND DEVICE, AND DISPLAY DEVICE

CROSS-REFERENCE TO RELATED APPLICATIONS

The present application claims the benefit of priority right of Chinese patent application with the application No. 201510376917.6, filed on Jun. 30, 2015 in China, which is incorporated by reference herein in its entirety.

TECHNICAL FIELD

The present disclosure relates to the field of display technology, and, more particularly, to a method and apparatus for compressing data information, a method and apparatus for decompressing data information, a method and apparatus for compensating for driving, and a display device.

BACKGROUND

Nowadays, display devices tend to being with large-size and high-resolution along with ever-increasing user demands. In order to satisfy the aforesaid trend, the number of sub-pixel units in a display device is increasing, but because of the large number of sub-pixel units, non-uniformity of display luminance often occurs when the display device displays an image. In order to improve uniformity of display luminance of the display device, it is necessary to acquire, with a sub-pixel unit as a basis, data information representing luminance capability of respective sub-pixel units, which corresponds to the sub-pixel units one to one, adopt an external compensating method based on the data information to compensate for luminance of the sub-pixel units, thereby improving uniformity of display luminance of the display device.

However, the amount of the data information is also very large due to the excessive number of sub-pixel units, and a significant amount of memory is required to store the data information. In order to reduce the memory occupied by the storage of the data information, it needs to compress the data information. Since variation ranges of the data information representing the luminance capability of the sub-pixel units have a certain correlation, meanwhile, and the data information representing the luminance capability of the sub-pixel units also has certain independence because the respective sub-pixel units are independent, if a lossless compression is adopted for the data information, it can not effectively reduce the memory occupied by the storage of the data information; if a lossy compensation is adopted for the data information, it will compromise accuracy of the data information, resulting in that it is impossible to make accurate compensation for the display device based on the decompressed data information, so luminance uniformity of the display device cannot be accurately improved.

SUMMARY

The present disclosure provides a method and apparatus for compressing data information, a method and apparatus for decompressing data information, a method and apparatus for compensating for driving, and a display device, for ensuring accuracy of the decompressed data information while reducing the space occupied by the storage of the data information.

Accordingly, the present disclosure provides the following technical solutions.

In a first aspect, the present disclosure provides a method for compressing data information, comprising:

acquiring data information corresponding to each sub-pixel unit, the data information representing a luminance capability of the sub-pixel unit;

establishing a distribution function model based on the data information;

obtaining an effective value selection interval based on the distribution function model and a preset effective threshold; and dividing the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, $0<M<1/N$.

In a second aspect, the present disclosure provides a method for decompressing data information, comprising:

acquiring N compressed data information blocks, each of the compressed data information blocks including multiple pieces of data information, and each of the compressed data information blocks corresponding to one compression section, N being a positive integer; and decompressing each of the compressed data information blocks, wherein each of the compressed data information blocks is decompressed to 1/M times of a size of each of the compressed data information blocks, a storage length of the data information obtained by the decompression being P, $0<M<1/N$.

In a third aspect, the present disclosure provides a method for compensating for driving, comprising:

acquiring data information corresponding to each sub-pixel unit, the data information representing a luminance capability of the sub-pixel unit;

establishing a distribution function model based on the data information;

obtaining an effective value selection interval based on the distribution function model and a preset effective threshold;

dividing the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, $0<M<1/N$;

acquiring N compressed data information blocks, each of the compressed data information blocks including multiple pieces of data information, and each of the compressed data information blocks corresponding to one compression section;

decompressing each of the compressed data information blocks, wherein each of the compressed data information blocks is decompressed to 1/M times of a size of each of the compressed data information blocks; and acquiring the decompressed data information, and compensating for the sub-pixel unit corresponding to the data information based on the data information.

In a fourth aspect, the present disclosure provides an apparatus for compressing data information, comprising:

an acquiring module for acquiring data information corresponding to each sub-pixel unit, the data information representing a luminance capability of the sub-pixel unit;

a model establishing module for establishing a distribution function model based on the data information;

an interval selection module for obtaining an effective value selection interval based on the distribution function model and a preset effective threshold; and a compression module for dividing the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, $0<M<1/N$.

In a fifth aspect, the present disclosure provides an apparatus for decompressing data information, comprising:

a block acquiring module for acquiring N compressed data information blocks, each of the compressed data information blocks including multiple pieces of data information, and each of the compressed data information blocks corresponding to one compression section, N being a positive integer;

a decompression module for decompressing each of the compressed data information blocks, wherein each of the compressed data information blocks is decompressed to 1/M times of a size of each of the compressed data information blocks, a storage length of the data information obtained by the decompression being P, $0<M<1/N$.

In a sixth aspect, the present disclosure provides an apparatus for compensating for driving, comprising:

an acquiring module for acquiring data information corresponding to each sub-pixel unit, the data information representing a luminance capability of the sub-pixel unit;

a model establishing module for establishing a distribution function model based on the data information;

an interval selection module for obtaining an effective value selection interval based on the distribution function model and a preset effective threshold;

a compression module for dividing the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, $0<M<1/N$.

a block acquiring module for acquiring N compressed data information blocks, each of the compressed data information blocks including multiple pieces of data information, and each of the compressed data information blocks corresponding to one compression section;

a decompression module for decompressing each of the compressed data information blocks, wherein each of the compressed data information blocks is decompressed to 1/M times of a size of each of the compressed data information blocks; and a compensation module for acquiring the decompressed data information, and compensating for the sub-pixel unit corresponding to the data information based on the data information.

In a seventh aspect, the present disclosure provides a display device, comprising the apparatus for compensating for driving in the technical solutions described above.

In the method and apparatus for compressing data information, the method and apparatus for decompressing data information, the method and apparatus for compensating for driving, and the display device provided by the present disclosure, a distribution function model is established based on the data information, an effective value selection interval is obtained based on the distribution function model and a preset effective threshold, the effective value selection interval is divided into N compression sections, data information corresponding to each of the compression sections is compressed into M times of a total size of data information corresponding to all sub-pixel units, N being a positive integer, $0<M<1/N$. In comparison to the known method in which lossless compression or lossy compression is performed on the total data information corresponding to all the sub-pixel units, in the present disclosure, the effective value selection interval is divided into a plurality of compression sections, so as to differentiate data information which is distributed densely from data information which is distributed sparsely, and the data information corresponding to each compression section is compressed to the same extent, so that the data information which is distributed densely is compressed to a relatively high extent, the data information which is distributed sparsely as compressed to a relatively low extent, so as to ensure accuracy of the compressed data information to a maximum extent, therefore, the accuracy of decompressed data information is ensured on the basis of reducing the space occupied by the storage of data information.

BRIEF DESCRIPTION OF THE DRAWINGS

The accompanying drawings herein constitute a part of the present disclosure and provide the further understanding of the present disclosure. The exemplary embodiments of the present disclosure and descriptions thereof illustrate the present disclosure without limiting the scope of the present disclosure. In the drawings.

DETAILED DESCRIPTION OF THE EMBODIMENTS

Hereinafter, detailed descriptions will be provided with reference to the drawings to further illustrate the method and apparatus for compressing data information, the method and apparatus for decompressing data information, the method and apparatus for compensating for driving, and the display device provided by the present disclosure.

First Embodiment

Figure 1:
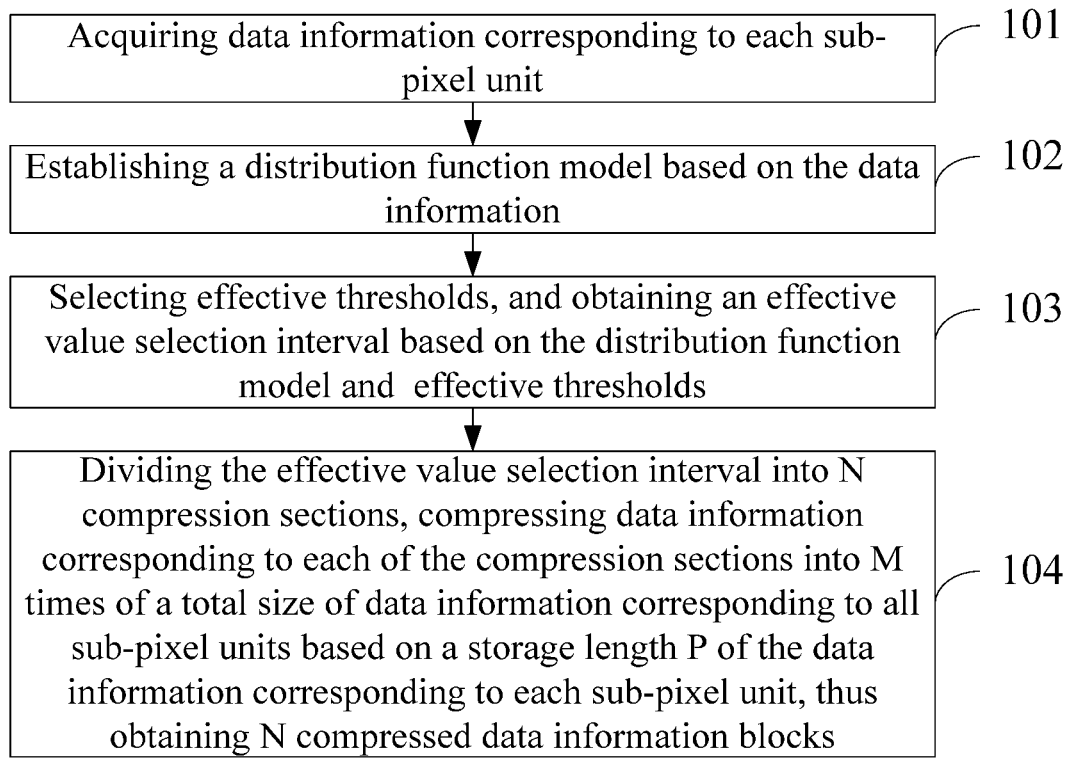
FIG. 1 is a flowchart of a method for compressing data information in a first embodiment of the present disclosure.

Referring to FIG. 1, a method for compressing data information provided by an embodiment of the present disclosure comprises the following.

In Step 101, data information corresponding to each sub-pixel unit is acquired; wherein the data information represents a luminance capability of the sub-pixel unit. An external circuit can be connected based on the data information to compensate for the sub-pixel units, so that respective sub-pixel units have a relatively high luminance uniformity.

In Step 102, a distribution function model is established based on the data information. The distribution function model can be a Gaussian distribution function model, a Poisson distribution function model, a Cauchy distribution function model and the like, wherein parameters required for establishing the distribution function model, such as expected value, variance, standard deviation, covariance, etc., can be obtained by conducting the statistics of the data information and performing a calculation thereon.

Figure 2:
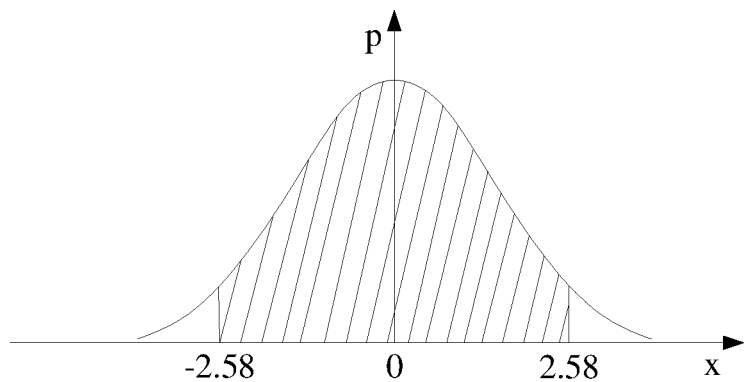
FIG. 2 is a first schematic diagram of a distribution function model in the first embodiment of the present disclosure.

In Step 103, an effective value selection interval is obtained based on the distribution function model and a preset effective threshold. The effective value selection Interval is an interval where the data information is mainly distributed, and the boundary values of the effective value selection interval are X1 and X2, respectively; an effective threshold is preset in advance, and the effective value selection interval is chose through the effective threshold, wherein the effective threshold can be set as needed in practice. For example, as illustrated in FIG. 2, the distribution function model is a standard Gaussian distribution function model, the effective threshold is set as 99%, and the area of the shadow portion occupies 99% of the area enclosed by the curve and the x-axis in FIG. 2; according to the calculation formula of the standard Gaussian distribution function, it can be obtained that $\Phi(x)=99.5\%$, and by looking up a table, it can be obtained that the effective value selection interval is [−2.58, 2.58], that is, the boundary values of the effective value selection interval is −2.58 and 2.58.

In Step 104, the effective value selection interval is divided into N compression sections, data information corresponding to each of the compression sections is compressed into M times of a total size of data information corresponding to all sub-pixel units based on a storage length P of the data information corresponding to each sub-pixel unit, thus obtaining N compressed data information blocks, N being a positive integer, $0<M<1/N$.

Figure 3:
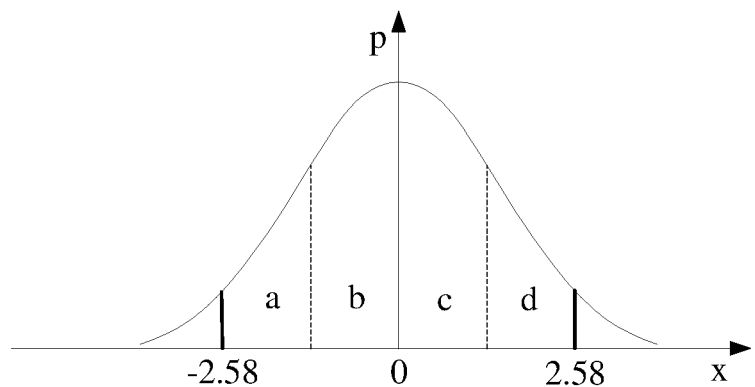
FIG. 3 is a second schematic diagram of a distribution function model in the first embodiment of the present disclosure.

For example, as illustrated in FIG. 3, the effective value selection interval is divided into four compression sections of a, b, c, d, and each compression section corresponds to data information distributed within this compression section. Depending on a storage length P of the data information, such as 4 bits, 8 bits, 16 bits, etc., a size of the compressed total data information corresponding to all the sub-pixel units is ½ times of a size of the total data information corresponding to all the sub-pixel units before being compressed, thus, the data information corresponding to the four compression sections of a, b, c, and d is compressed to ⅛ times of the size of the total data information corresponding to all the sub-pixel units before being compressed, that is, $M=⅛$, the storage length of the compressed data information is less than the storage length P of the data information before being compressed. The distribution of the data information in the compression section b and the compression section c is relatively dense, the distribution of the data information in the compression section a and the compression section d is relatively sparse, and the data information corresponding to each of the four compression sections of a, b, c, d are compressed to ⅛ times of the size of the total data information corresponding to all the sub-pixel units, so that the data information, which is distributed relatively densely, is compressed to a relatively high extent, the data information which is distributed relatively sparsely, is compressed to relatively low extent.

Figure 4:
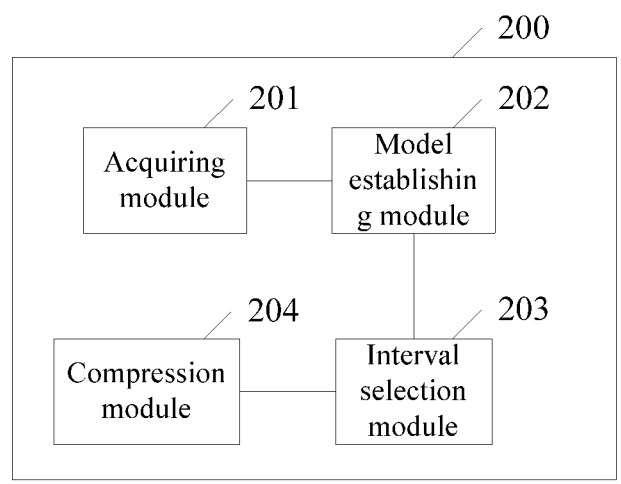
FIG. 4 is a schematic diagram of a configuration of an apparatus for compressing data information in the first embodiment of the present disclosure.

Referring to FIG. 4, corresponding to the method for compressing data information described above in the first embodiment, this embodiment further provides an apparatus 200 for compressing data information, the apparatus 200 comprises:

an acquiring module 201 for acquiring data information corresponding to each sub-pixel unit, the data information representing a luminance capability of the sub-pixel unit;

a model establishing module 202 for establishing a distribution function model based on the data information;

an interval selection module 203 for obtaining an effective value selection interval based on the distribution function model and a preset effective threshold; and a compression module 204 for dividing the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, $0<M<1/N$.

Further, $M=(\log_2 N)/(N*P)$.

In the method and apparatus for compressing data information provided by the present disclosure, a distribution function model is established based on the data information, an effective value selection interval is obtained based on the distribution function model and a preset effective threshold, the effective value selection interval is divided into N compression sections, data information corresponding to each of the compression sections is compressed into M times of a total size of data information corresponding to all sub-pixel units, N being a positive integer, 0<M<1/N. In comparison to the known method of performing lossless compression or lossy compression on the total data information corresponding to all the sub-pixel units the present disclosure divides the effective value selection interval into a plurality of compression sections, so as to differentiate data information which is distributed densely from data information which is distributed sparsely, and compress the data information corresponding to each compression section to the same extent, so that the data information which is distributed densely is compressed to a relatively high extent, the data information which is distributed sparsely is compressed to a relatively low extent, ensuring the accuracy of the compressed data information to a maximum extent, therefore, accuracy of decompressed data information is ensured on the basis of reducing the space occupied by the storage of data information.

Second Embodiment

Figure 5:
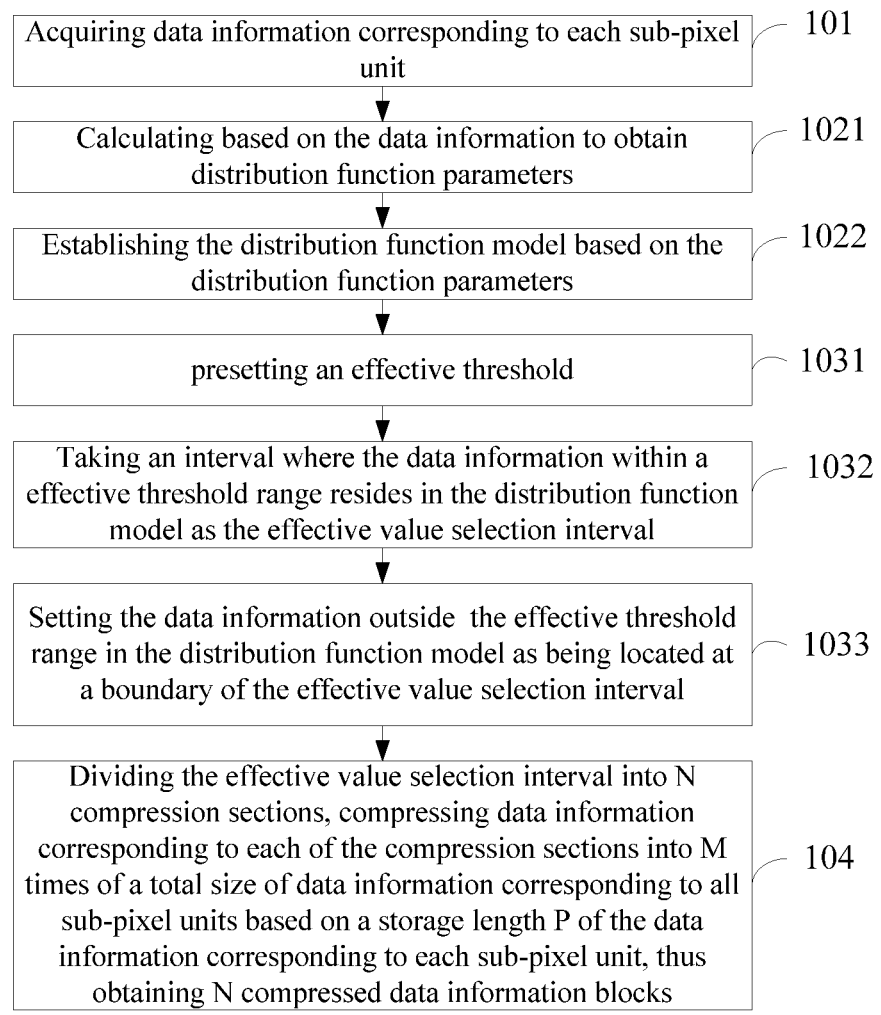
FIG. 5 is a flowchart of a method for compressing data information in a second embodiment of the present disclosure.

It is possible that some data information in the data information belongs to abnormal data information, for example, if a certain sub-pixel unit always lights on/off, or is a dead pixel, then the data information corresponding to this sub-pixel unit is abnormal data information; when the compensation is performed for the sub-pixel units, the abnormal data information will affect the luminance uniformity of the other sub-pixel units around this sub-pixel unit corresponding to the abnormal data information. In order to reduce the influence caused by the abnormal data information on the luminance uniformity of the other sub-pixel units, it will be illustrated in this embodiment how to process the abnormal data information in the specific steps of obtaining the effective value selection interval, on the basis of the first embodiment; besides, it will be further illustrated in this embodiment how to establish the distribution function model in particular. Referring to FIG. 5, step 102 in the first embodiment can be subdivided to steps 1021 to 1022, step 103 in the first embodiment can be subdivided to steps 1031 to 1033, and steps 1021 to 1022 and steps 1031 to 1033 comprise the following in particular.

In Step 1021, calculating is performed based on the data information to obtain distribution function parameters, wherein after acquiring data information, the acquired data information is calculated to obtain distribution function parameters, and the distribution function parameters can include expected value, variance, standard deviation, average etc.

In Step 1022, the distribution function model is established based on the distribution function parameters. The distribution function model can be established based on the distribution function parameters obtained in step 1021, as for a specific form of the distribution function model, reference can be made to descriptions of the step 102 in the first embodiment, and details will not be repeated here.

In Step 1031, an effective threshold is preset in advance. Reference can be made to descriptions of the step 103 in the first embodiment, details will not be repeated here.

In Step 1032, an interval where the data information within an effective threshold range resides in the distribution function model is taken as the effective value selection interval. As for how to obtain the effective value selection interval based on the effective threshold, reference can be made to descriptions of the step 103 in the first embodiment, and details will not be repeated here.

In Step 1033, the data information outside the effective threshold range in the distribution function model is set as being located at a boundary of the effective value selection interval. Data information outside the effective threshold range is abnormal data information, referring to FIG. 2, the non-shaded portion in the interval enclosed by the curve and the x-axis in FIG. 2 is the interval where the data information outside the effective threshold range resides; if the data information outside the effective threshold range is directly ignored, data overflow may probably occur during a subsequent process of compressing the data information, and in order to avoid data overflow and meanwhile reduce the influence caused by the abnormal data information on the luminance uniformity of the other sub-pixel units, the data information outside the effective threshold range is set as being located at the boundary of the effective value selection interval Specifically, the effective value selection interval is set as [X1, X2], when x<X1, that is, distribution of the data information is located on a left side outside the effective value selection interval, the data information is set as being located at a left boundary X1 of the effective value selection interval; when x>X2, that is, when distribution of the data information is located on a right side outside the effective value selection interval, the data information is set as being located on a right boundary X2 of the effective value selection interval.

Figure 6:
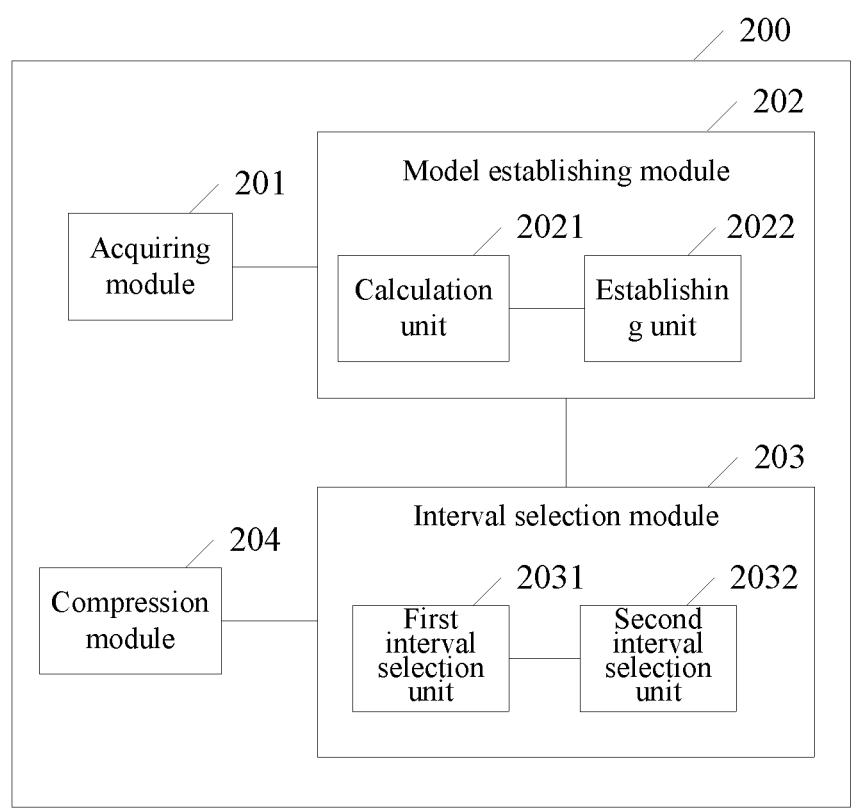
FIG. 6 is a schematic diagram of a configuration of an apparatus for compressing data information in the second embodiment of the present disclosure.

In addition, the relationship among the compression times M, the number N of the compression sections, and the storage length P of the data information is illustrated below; $M=(\log_2 N)/(N*P)$, the storage length occupied by the data information is compressed to the times of $(\log_2 N)/(N*P)$. For example, the number of the compression sections is N=4, the storage length of the data information is 8 bits, that is P=8, then $M=(\log_2 4)/(4*8)=1/16$, the data information that occupies 8 bits is compressed to 2 bits, that is, being compressed to ¼ of the original storage length Referring to FIG. 6, corresponding to the method for compressing data information described above in the second embodiment, on basis of the first embodiment, the model establishing module 202 comprises:

a calculating unit 2021 for performing a calculation based on the data information to obtain distribution function parameters; and an establishing unit 2022 for establishing the distribution function model based on the distribution function parameters.

The interval selection module 203 comprises:

a first interval selection unit 2031 for taking an interval where the data information within an effective threshold range resides in the distribution function model as the effective value selection interval; and a second interval selection unit 2032 for setting the data information outside the effective threshold range in the distribution function model as being located at a boundary of the effective value selection interval.

Third Embodiment

Figure 7:
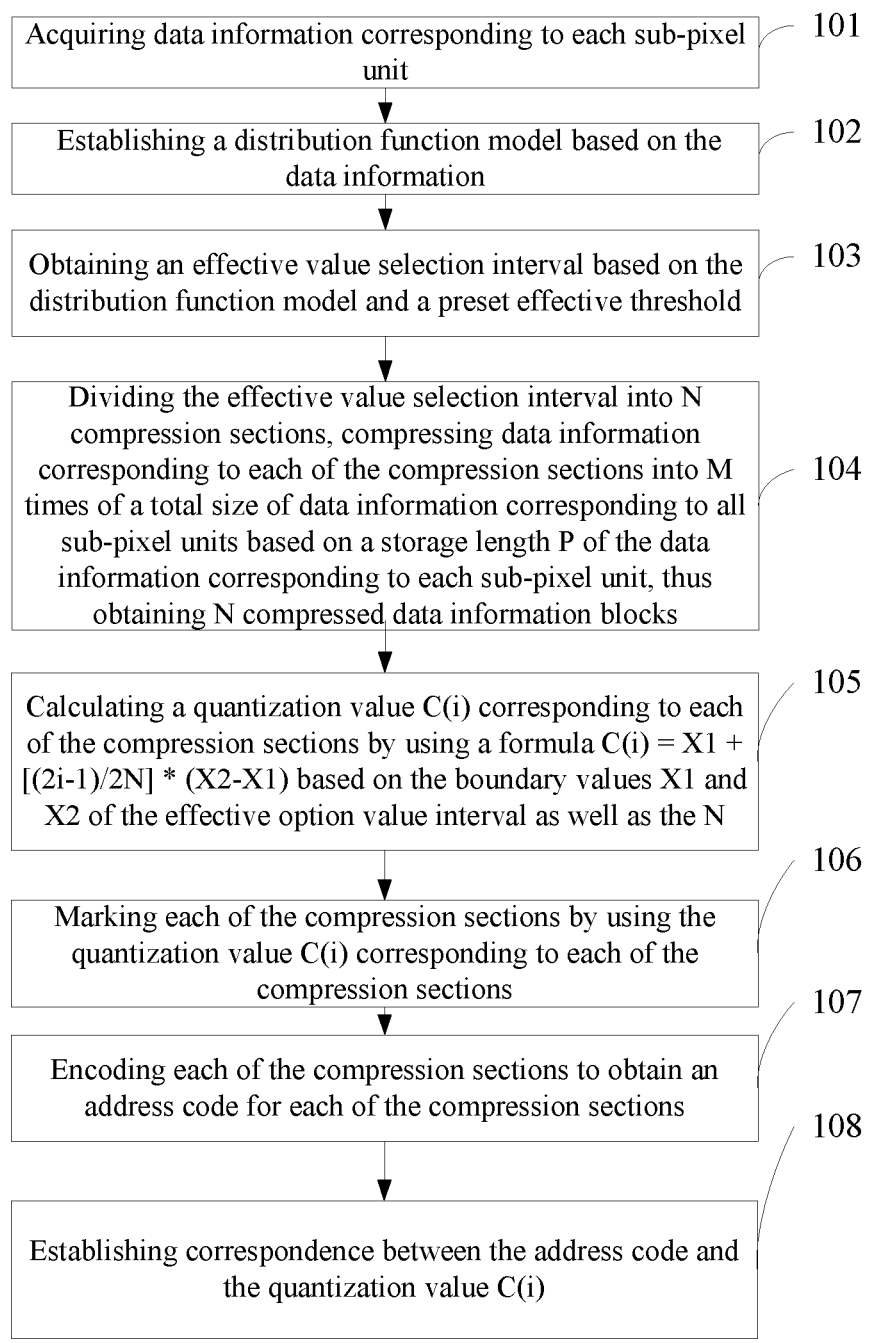
FIG. 7 is a flowchart of a method for compressing data information in a third embodiment of the present disclosure.

Referring to FIG. 7, in order to look up the compressed data information (i.e., compressed data information blocks)

quickly, on the basis of the first embodiment, steps 105 to 108 can be added to the method for compressing data information after step 104, and steps 105 to 108 comprises the following.

Figure 8:
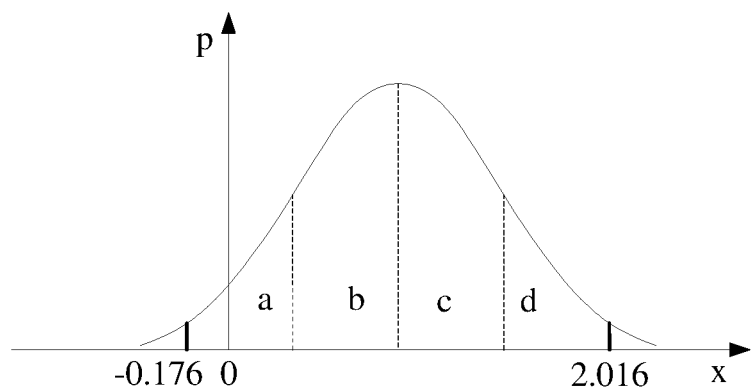
FIG. 8 is a schematic diagram of a distribution function model in the third embodiment of the present disclosure.

Step 105, a quantization value C(i) corresponding to each of the compression sections is calculated by using a formula $C(i)=X1+[(2i-1)/2N]*(X2-X1)$ based on the boundary values X1 and X2 of the effective value selection interval as well as the N, wherein X1<X2, i being a positive integer and $1 \le i \le N$. For example, as illustrated in FIG. 8, the boundary values of the effective value selection interval are X1=−0.176, X2=2.016, and the number of the compression sections is N=4, therefore, the quantization value corresponding to the compression section a is $C(1)=-0.176+(\frac{1}{8})*(2.016+0.176)=0.098$, the quantization value corresponding to the compression region b is $C(2)=-0.176+(\frac{3}{8})*(2.016+0.176)=0.646$, the quantization value corresponding to the compression region c is $C(3)=-0.176+(\frac{5}{8})*(2.016+0.176)=1.194$, and the quantization value corresponding to the compression region d is $C(4)=-0.176+(\frac{7}{8})*(2.016+0.176)=1.742$, that is, an intermediate value of each compression section is taken as the quantization value of this compression section.

In Step 106, each of the compression sections is marked by using the quantization value C(i) corresponding to the compression section, wherein the quantization value is taken as an identifier of the compression section.

In Step 107, each of the compression sections is encoded to obtain an address code for each of the compression sections. A format of the encoding can be a binary code, octal code, decimal code and etc. Since the binary code is adopted in most of the current display devices, display terminals, the binary code is taken as an example to illustrate the principle of the embodiment. Specifically, encoding can be performed according to the number N of the compression sections, $\log_2 N$ is calculated and taken as a bit number of the address code obtained from the encoding. For example, if N=4, the address code obtained from the encoding is 2 bits, address codes of the 4 compression sections are 00, 01, 10 and 11, respectively; if N=8, the address code obtained from the encoding is 3 bits, and address codes of the 8 compression sections are 000, 001, 010, 011, 100, 101, 110, 111, respectively.

Figure 9:
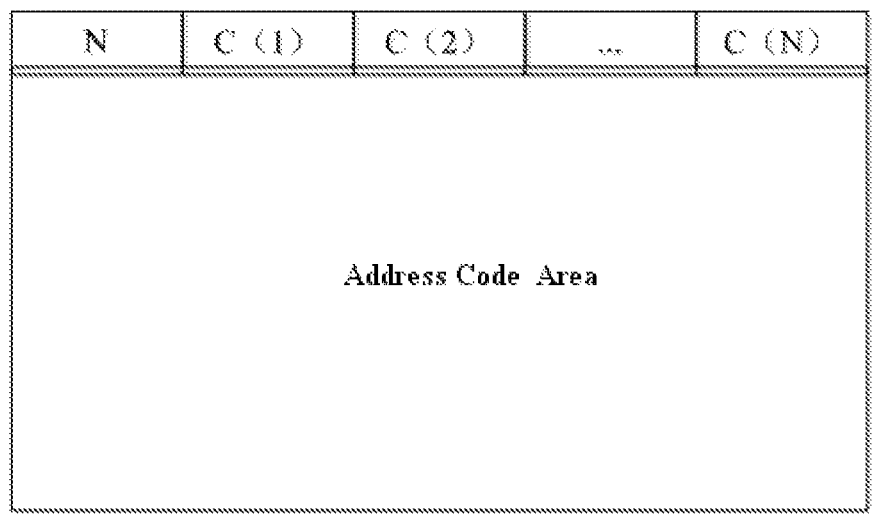
FIG. 9 is an explanatory schematic diagram of storing data information in the third embodiment of the present disclosure.

In Step 108, correspondence between the address code and the quantization value C(i) is established. The address code and the compression section have correspondence, and the compression section and the quantization value C(i) also have correspondence; the correspondence between the address code and the quantization value C(i) is established with the quantization value C(i) as an identifier, so that when decompressing the compressed data information, it is possible to quickly find the compressed data information blocks corresponding to the compression section that needs to be decompressed according to the address code. A format of storing the data information in the memory of the apparatus for compressing data information can be as illustrated in FIG. 9, wherein the number N of the compression sections is stored at an intersection of the first row and the first column, so as to represent the bit number of the address code, the quantization value C(i) corresponding to each compression section is stored at the beginning of each column, and the address code can be stored in an address code area below the quantization value C(i). Further, two adjacent address codes can be compared to each other to perform lossless compression, thereby reducing the space occupied by the storage of the address codes.

Figure 10:
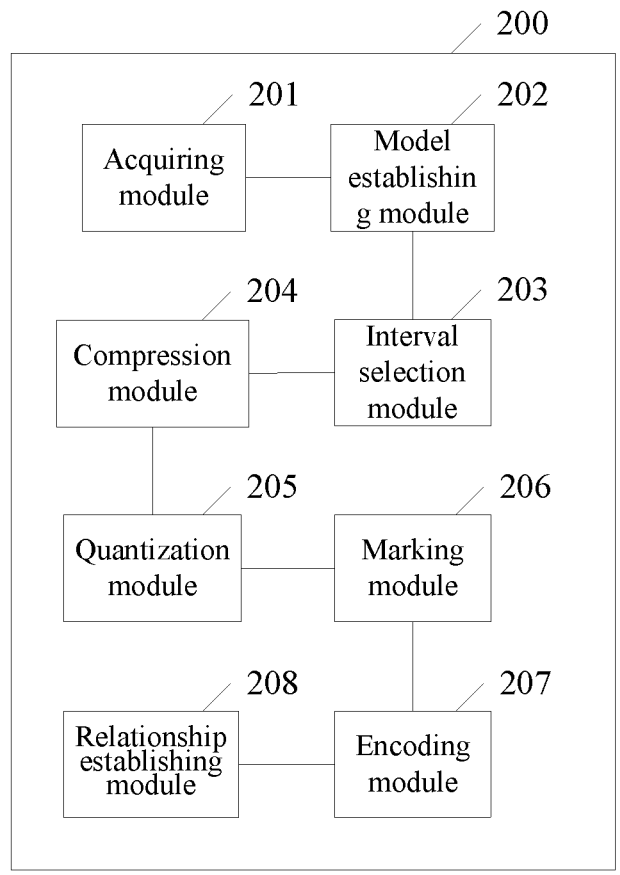
FIG. 10 is a schematic diagram of a configuration of an apparatus for compressing data information in the third embodiment of the present disclosure.

Referring to FIG. 10, corresponding to the method for compressing data information described above in the third embodiment, on the basis of the first embodiment, the apparatus 200 for compressing the data information further comprises:

a quantization module 205 for calculating a quantization value C(i) corresponding to each of the compression sections by using a formula $C(i)=X1+[(2i-1)/2N]*(X2-X1)$ based on the boundary values X1 and X2 of the effective value selection interval as well as the N, wherein X1<X2, i being a positive integer and $1 \le i \le N$;

a marking module 206 for marking each of the compression sections by using the quantization value C(i) corresponding to each of the compression sections;

an encoding module 207 for encoding each of the compression sections to obtain an address code for each of the compression sections; and a relationship establishing module 208 for establishing correspondence between the address code and the quantization value C(i).

Fourth Embodiment

Figure 11:
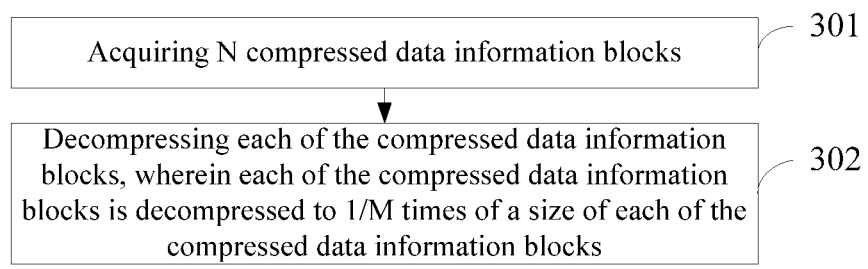
FIG. 11 is a flowchart of a method for decompressing data information in a fourth embodiment of the present disclosure.

Referring to FIG. 11, corresponding to the method for compressing data information described in the above embodiments, the present disclosure further provides a method for decompressing data information, comprising the following steps.

In Step 301, N compressed data information blocks are acquired, wherein each of the compressed data information blocks including multiple pieces of compressed data information, and each of the compressed data information blocks corresponding to one compression section, N being a positive integer. As for detailed illustrations of the data information and the compression section, reference can be made to the descriptions in the first embodiment, the second embodiment, and the third embodiment, details will not be repeated here.

In Step 302, each of the compressed data information blocks is decompressed, and each of the compressed data information blocks is decompressed to 1/M times of a size of each of the compressed data information blocks, wherein a storage length of the data information obtained by decompression is P, 0<M<1/N. Specifically, $M=(\log_2 N)/(N*P)$.

Figure 12:
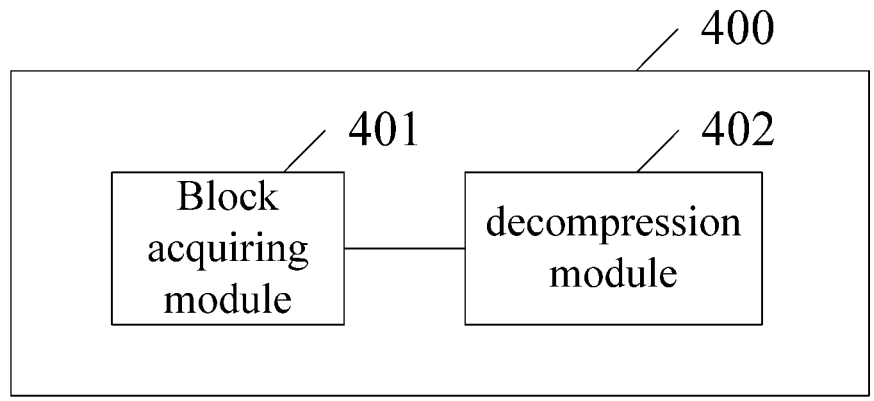
FIG. 12 is a schematic diagram of a configuration of an apparatus for decompressing data information in the fourth embodiment of the present disclosure.

Referring to FIG. 12, corresponding to the method for decompressing data information described above in the fourth embodiment, this embodiment further provides an apparatus 400 for decompressing data information, the apparatus 400 comprises:

a block acquiring module 401 for acquiring N compressed data information blocks, each of the compressed data information blocks including multiple pieces of data information, and each of the compressed data information blocks corresponding to one compression section, N being a positive integer; and a decompression module 402 for decompressing each of the compressed data information blocks, decompressing each of the compressed data information blocks to 1/M times of a size of each of the compressed data information blocks, a storage length of the data information obtained by decompression being P, 0<M<1/N.

Further, $M=(\log_2 N)/(N*P)$.

In the method and apparatus for decompressing data information, the compressed data information blocks, which are obtained from compression performed by adopting the method for compressing information blocks provided by the present disclosure, can be decompressed. In comparison to the known method for decompressing data information resulting from performing lossless compression or lossy compression on the total data information corresponding to all the sub-pixel units, in the present disclosure, since data information which is distributed relatively densely is compressed to compressed data information blocks with a relatively high compression extent, and data information which is distributed relatively sparsely is compressed to compressed data information blocks with a relatively low compression extent, accuracy of the compressed data information is ensured to a maximum extent, therefore, data information having high accuracy can be obtained after decompressing the compressed data information blocks.

Fifth Embodiment

Figure 13:
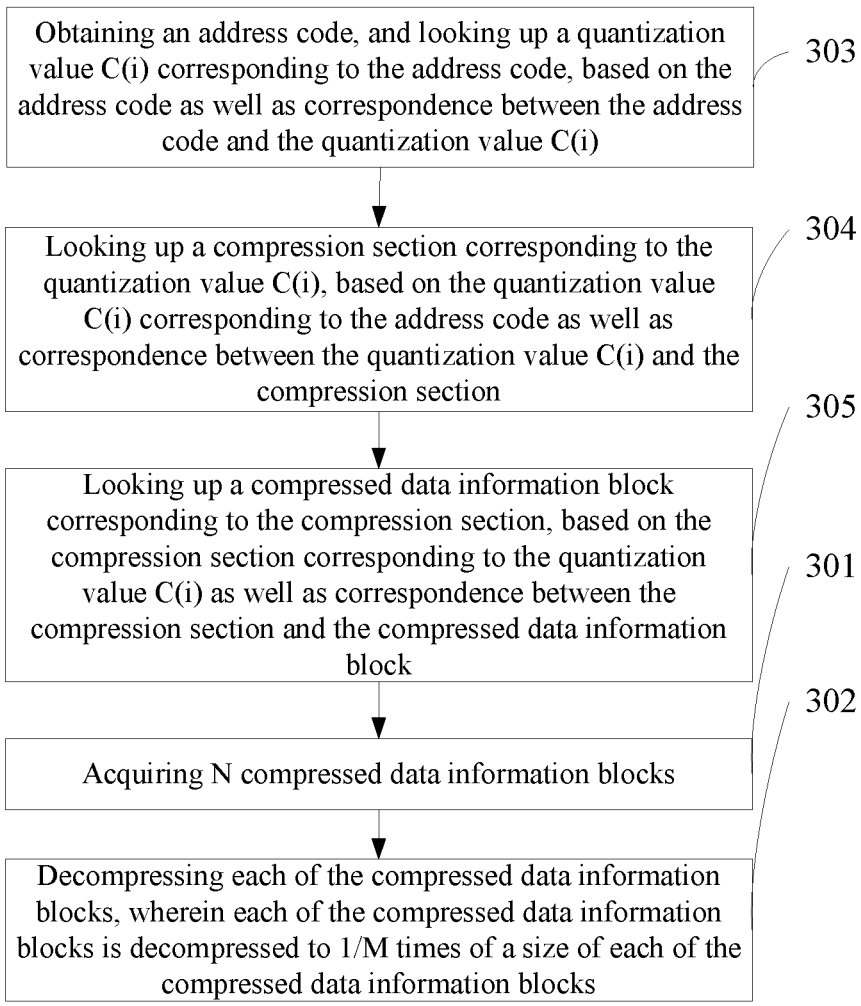
FIG. 13 is a flowchart of a method for decompressing data information in a fifth embodiment of the present disclosure.

Referring to FIG. 13, in order to look up the compressed data information blocks quickly upon the decompression, on the basis of the fourth embodiment, steps 303 to 305 can be added to the method for compressing data information prior to step 301, and steps 303 to 305 comprises the following in particular.

In Step 303, an address code is obtained, and a quantization value $C(i)$ corresponding to the address code is looked up based on the address code as well as correspondence between the address code and the quantization value $C(i)$. As for detailed illustrations of the address code and the quantization value $C(i)$, reference can be made to the first embodiment, the second embodiment, the third embodiment, details will not be repeated here.

In Step 304, a compression section corresponding to the quantization value $C(i)$ is looked up based on the quantization value $C(i)$ corresponding to the address code as well as correspondence between the quantization value $C(i)$ and the compression section. As for detailed illustrations of the compression section, reference can be made to the first embodiment, the second embodiment, the third embodiment, details will not be repeated here.

In Step 305, a compressed data information block corresponding to the compression section is looked up based on the compression section corresponding to the quantization value $C(i)$ as well as correspondence between the compression section and the compressed data information block. The compressed data information blocks that need to be decompressed can be found quickly based on the correspondence among the address code, the quantization value $C(i)$, and the compression section, reducing the time required for decompression.

Figure 14:
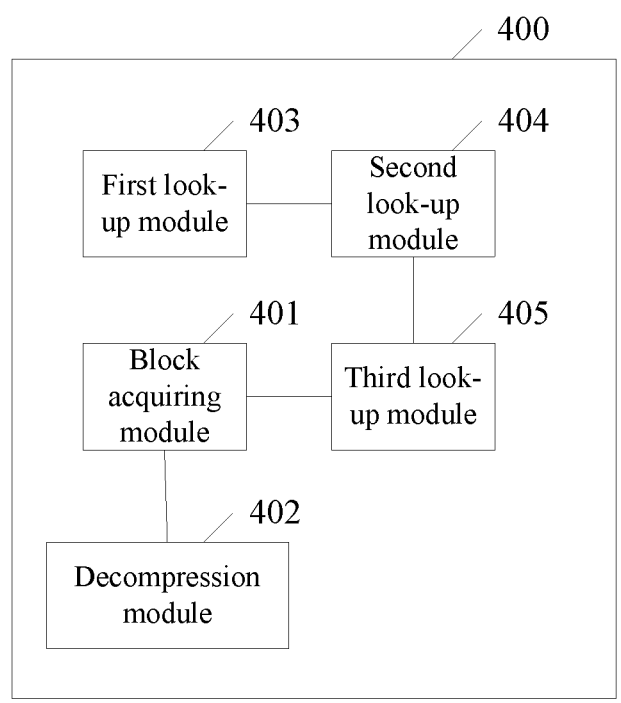
FIG. 14 is a schematic diagram of a configuration of an apparatus for decompressing data information in the fifth embodiment of the present disclosure.

Referring to FIG. 14, corresponding to the method for decompressing data information described above in the fifth embodiment, on the basis of the fourth embodiment, the apparatus 400 for decompressing data information further comprises:

a first look-up module 403 for obtaining an address code, and looking up a quantization value $C(i)$ corresponding to the address code, based on the address code as well as correspondence between the address code and the quantization value $C(i)$;

a second look-up module 404 for looking up a compression section corresponding to the quantization value $C(i)$ based on the quantization value $C(i)$ corresponding to the address code as well as correspondence between the quantization value $C(i)$ and the compression section; and a third look-up module 405 for looking up a compressed data information block corresponding to the compression section, based on the compression section corresponding to the quantization value $C(i)$ as well as correspondence between the compression section and the compressed data information block.

Sixth Embodiment

Figure 15:
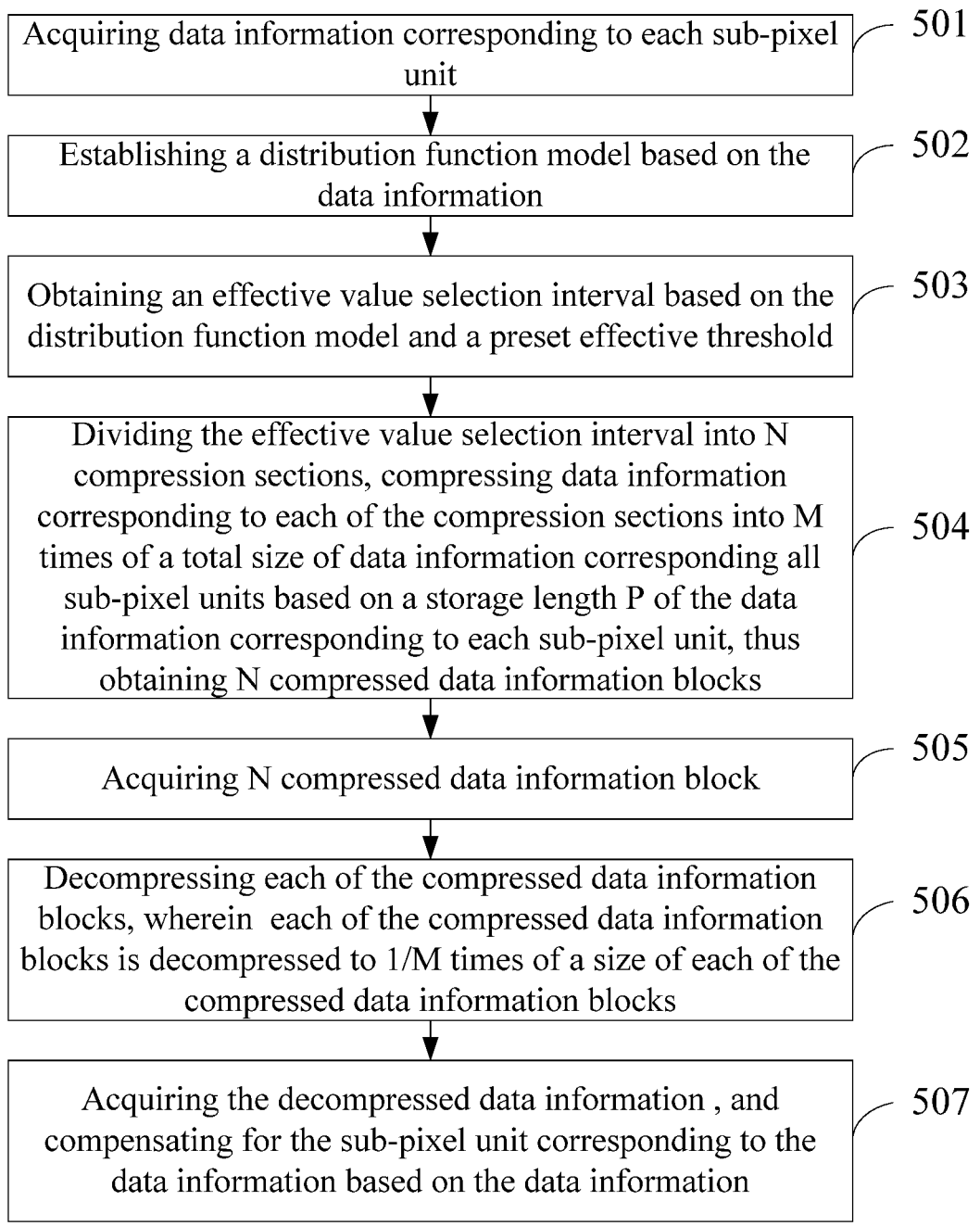
FIG. 15 is a flowchart of a method for compensating for driving in a sixth embodiment of the present disclosure.

Referring to FIG. 15, in conjunction with the method for compressing data information and the method for decompressing data information, the present disclosure further provides a method for compensating for driving, which can be applied to a display device, the method comprises the following steps.

In Step 501, data information corresponding to each sub-pixel unit is acquired, the data information representing a luminance capability of the sub-pixel unit.

In Step 502, a distribution function model is established based on the data information.

In Step 503, an effective value selection interval is obtained based on the distribution function model and a preset effective threshold.

In Step 504, the effective value selection interval is divided into N compression sections, and data information corresponding to each of the compression sections is compressed into M times of a total size of data information corresponding to all sub-pixel units based on a storage length P of the data information corresponding to each sub-pixel unit, thus obtaining N compressed data information blocks, N being a positive integer, $0<M<1/N$.

In Step 505, N compressed data information blocks are acquired, each of the compressed data information blocks including multiple pieces of data information, and each of the compressed data information blocks being corresponded to one compression section;

In Step 506, each of the compressed data information blocks is decompressed, wherein each of the compressed data information blocks is decompressed to $1/M$ times of a size of each of the compressed data information blocks; and In Step 507, the decompressed data information is acquired, and the sub-pixel unit corresponding to the data information is compensated for based on the data information.

It should be noted that, as for detailed illustrations of the above steps 501 to 506, reference can be made to descriptions for the respective steps in the first embodiment to the fifth embodiments, and the sub-division of some steps in the first embodiment to the fifth embodiment or other steps added before or after some steps are also applicable to this embodiment, details will not be repeated here.

Figure 16:
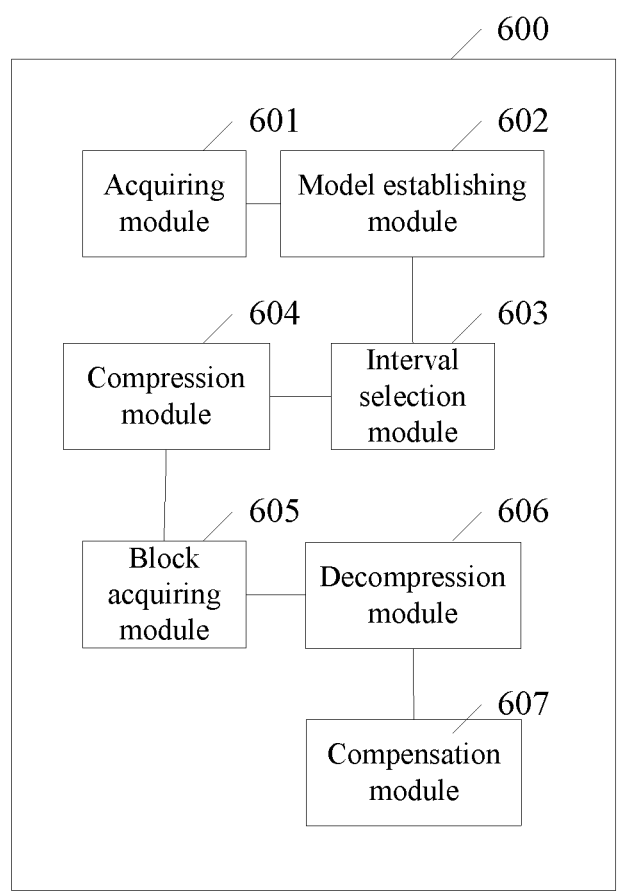
FIG. 16 is a schematic diagram of a configuration of an apparatus for compensating for driving in the sixth embodiment of the present disclosure.

Referring to FIG. 16, corresponding to the method for compensating for driving, this embodiment of the present disclosure further provides an apparatus 600 for compensating for diving, the apparatus 600 comprises:

an acquiring module 601 for acquiring data information corresponding to each sub-pixel unit, the data information representing a luminance capability of the sub-pixel unit;

a model establishing module 602 for establishing a distribution function model based on the data information;

an interval selection module 603 for obtaining an effective value selection interval based on the distribution function model and a preset effective threshold;

a compression module 604 for dividing the effective value selection interval into N compression sections, and compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, 0<M<1/N.

a block acquiring module 605 for acquiring N compressed data information blocks, each of the compressed data information blocks including multiple pieces of data information, and each of the compressed data information blocks corresponding to one compression section;

a decompression module 606 for decompressing each of the compressed data information blocks, decompressing each of the compressed data information blocks to 1/M times of a size of each of the compressed data information blocks; and a compensation module 607 for acquiring the decompressed data information, and compensating for the sub-pixel unit corresponding to the data information based on the data information.

It should be noted that, as for detailed illustrations of the respective modules described above, reference can be made to descriptions for the respective modules in the first embodiment to the fifth embodiments, and descriptions regarding the units included in some modules and other modules that can be comprised in the apparatus in the first embodiment to the fifth embodiment are also applicable to this embodiment, details will not be repeated here.

In the method and apparatus for compensating for driving provided by the embodiment of the present disclosure, before the sub-pixel unit is compensated for, the data information corresponding to the sub-pixel unit is compressed by using the method for compressing data information provided by the present disclosure and then stored, so as to reduce the storage space occupied by the storage of the data information; at the time of compensating for the sub-pixel unit, the compressed data information is decompressed by using the method for decompressing data information provided by the present disclosure, and the decompressed data information is used to compensate for the sub-pixel unit. Since using the methods for compressing, decompressing data information provided by the present disclosure can ensure accuracy of the compressed data information and the decompressed data information per se, the process in which the sub-pixel units are compensated for is more accurate, and luminance uniformity of the compensated sub-pixel units is improved.

Seventh Embodiment

The present disclosure further provides a display device comprising the apparatus for compensating for driving described in the above embodiments, wherein the advantages of the apparatus for compensating for driving in the display device are the same as those of the apparatus for compensating for driving described in the above embodiments, details will not be repeated here. Specifically, the display device can be any product or component having a display function such as OLED display panel, electronic paper, mobile phone, tablet computer, television, display monitor, notebook computer, digital photo frame, navigator, and so on.

The respective embodiments in this specification are described by a progressive way, the same or similar portions between the respective embodiments can be referred to mutually, and each embodiment emphasizes on its differences from the other embodiments. Especially, the apparatus embodiments are described more briefly, since they are substantively similar to the method embodiments, as for where relevant, reference can be made to the descriptions in the method embodiments.

In the above descriptions of implementations, the specific features or characteristics can be combined in a proper manner in any one or more embodiments or examples.

Those skilled in the art should understand that, the embodiments of the present disclosure can be provided as a method, an apparatus (device) or a computer program product. Therefore, the present disclosure can adopt the forms such as a full hardware embodiment, a full software embodiment, or an embodiment combining software and hardware aspects. Further, the present disclosure can adopt the forms of a computer program product implemented on one or more available computer storage mediums (including, but not limited to, magnetic disk storage, CD-ROM, optical memory, or the like) including available computer program codes.

The present disclosure is described by referring to flow charts and/or block diagrams of method, apparatus (device) and computer program product according to the embodiments of the present disclosure. It should be understood that each flow and/or block in the flow charts and/or block diagrams and the combination of the flow and/or block in the flow charts and/or block diagrams can be implemented by computer program instructions. These computer program instructions can be provided to processors to generate a machine, so that a device for implementing functions specified in one or more flows of the flow charts and/or one or more blocks of the block diagrams is generated by the processors executing the instructions.

These computer program instructions can also be stored in computer readable storage which is able to direct the processors to operate in specific manners, so that the instructions stored in the computer readable storage generate products including an instruction device, which implements functions specified by one or more flows in the flow charts and/or one or more blocks in the block diagrams.

Figure 17:
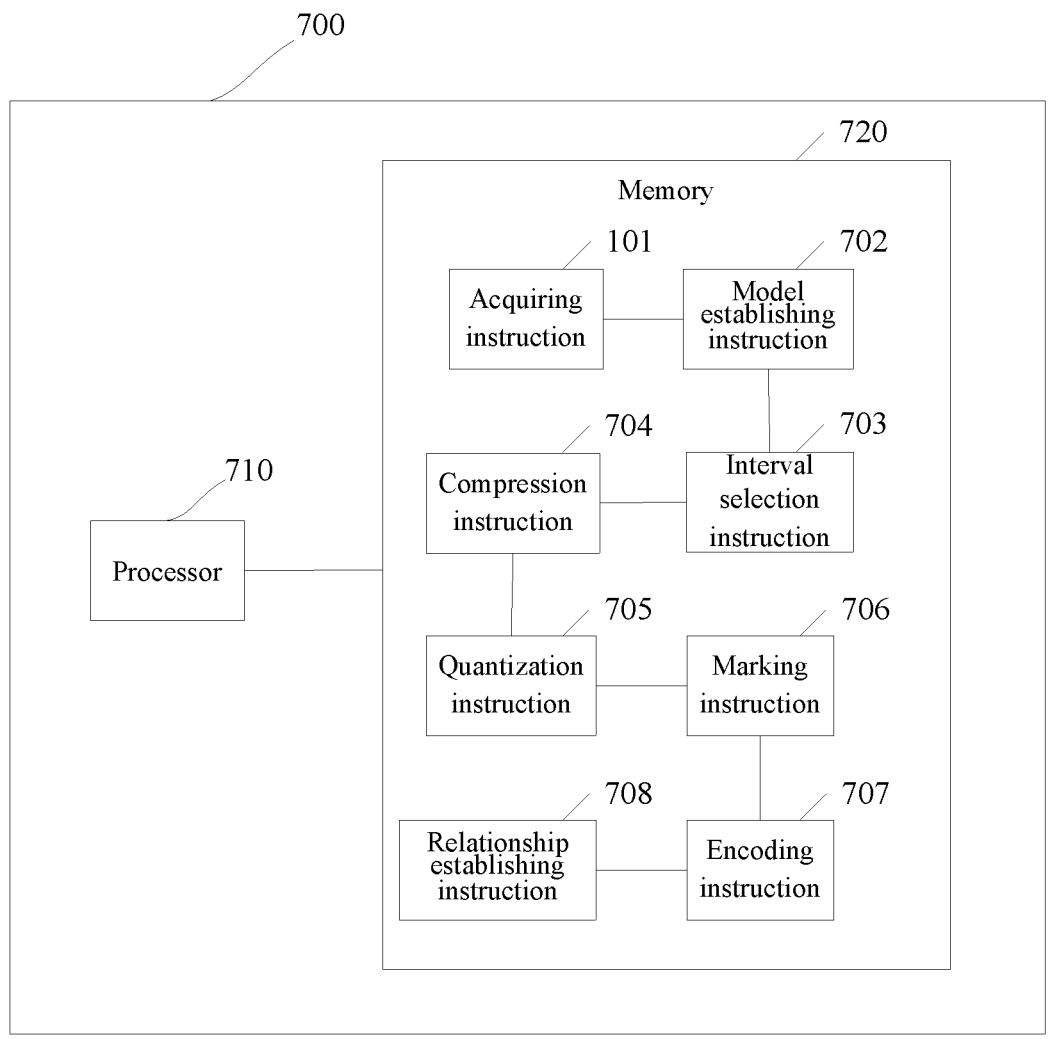
FIG. 17 is a schematic diagram of a specific configuration of an apparatus for compressing data information in an embodiment of the present disclosure.

FIG. 17 is a schematic diagram of a specific configuration of an apparatus for compressing data information in an embodiment of the present disclosure. As illustrated in FIG. 17, the apparatus 700 for compressing data information comprises a memory 720 and a processor 710. The memory 720 is for storing an acquiring instruction 701, a model establishing instruction 702, an interval selection instruction 703, a compressing instruction 704, a quantizing instruction 705, a marking instruction 706, an encoding instruction 707, and a relationship establishing instruction 708.

The processor 710 is configured to communicate with the memory 720, and execute the acquiring instruction 701, the model establishing instruction 702, the interval selection instruction 703, the compressing instruction 704, the quantizing instruction 705, the marking instruction 706, the encoding instruction 707, and the relationship establishing instruction 708, so as to execute the operations of the acquiring module 201, the model establishing module 202, the interval selection module 203, the compression module 204, the quantization module 205, the marking module 206, the encoding module 207, and the relationship establishing module 208 described above, respectively.

Figure 18:
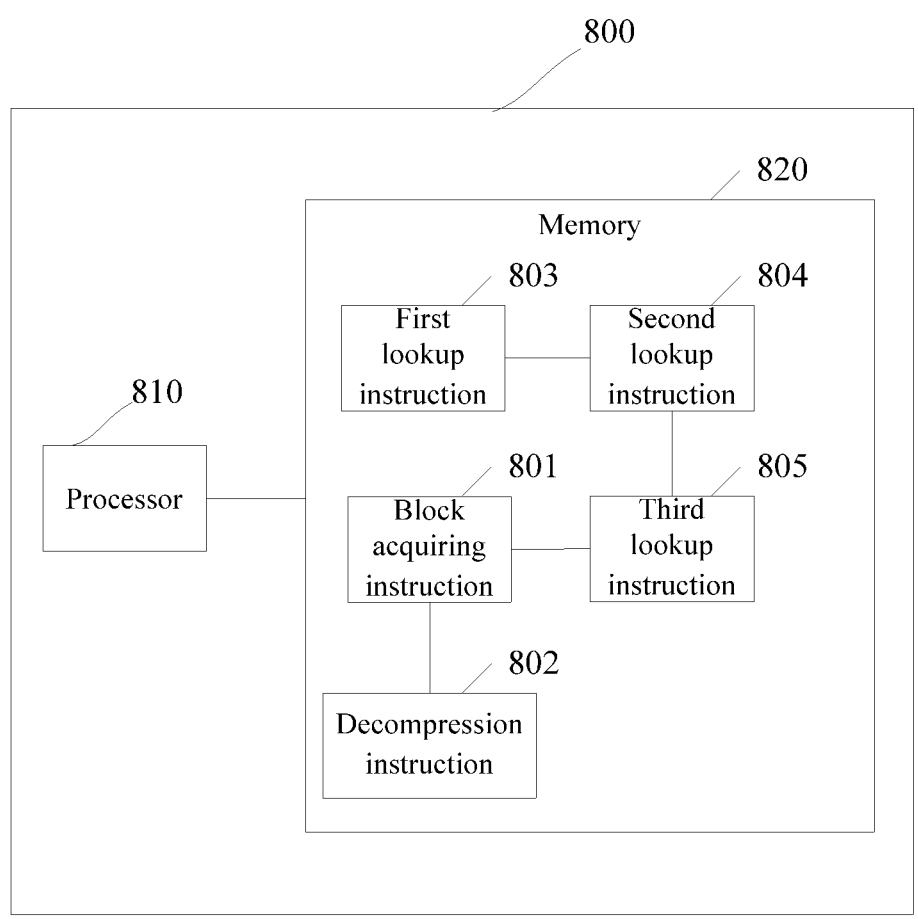
FIG. 18 is a schematic diagram of a specific configuration of an apparatus for decompressing data information in an embodiment of the present disclosure.

FIG. 18 is a schematic diagram of a specific configuration of an apparatus for decompressing data information in an embodiment of the present disclosure. As illustrated in FIG. 18, the apparatus 800 for decompressing data information comprises a memory 820 and a processor 810. The memory 820 is configured to store a block acquiring instruction 801, a decompressing instruction 802, a first lookup instruction 803, a second lookup instruction 804, and a third lookup instruction 805.

The processor 810 is configured to communicate with the memory 820, and execute the block acquiring instruction 801, the decompressing instruction 802, the first lookup instruction 803, the second lookup instruction 804, and the third lookup instruction 805, so as to execute the operations of the acquiring module 401, the decompression module 402, the first lookup module 403, the second lookup module 404, and the third lookup module 405 described above, respectively.

Figure 19:
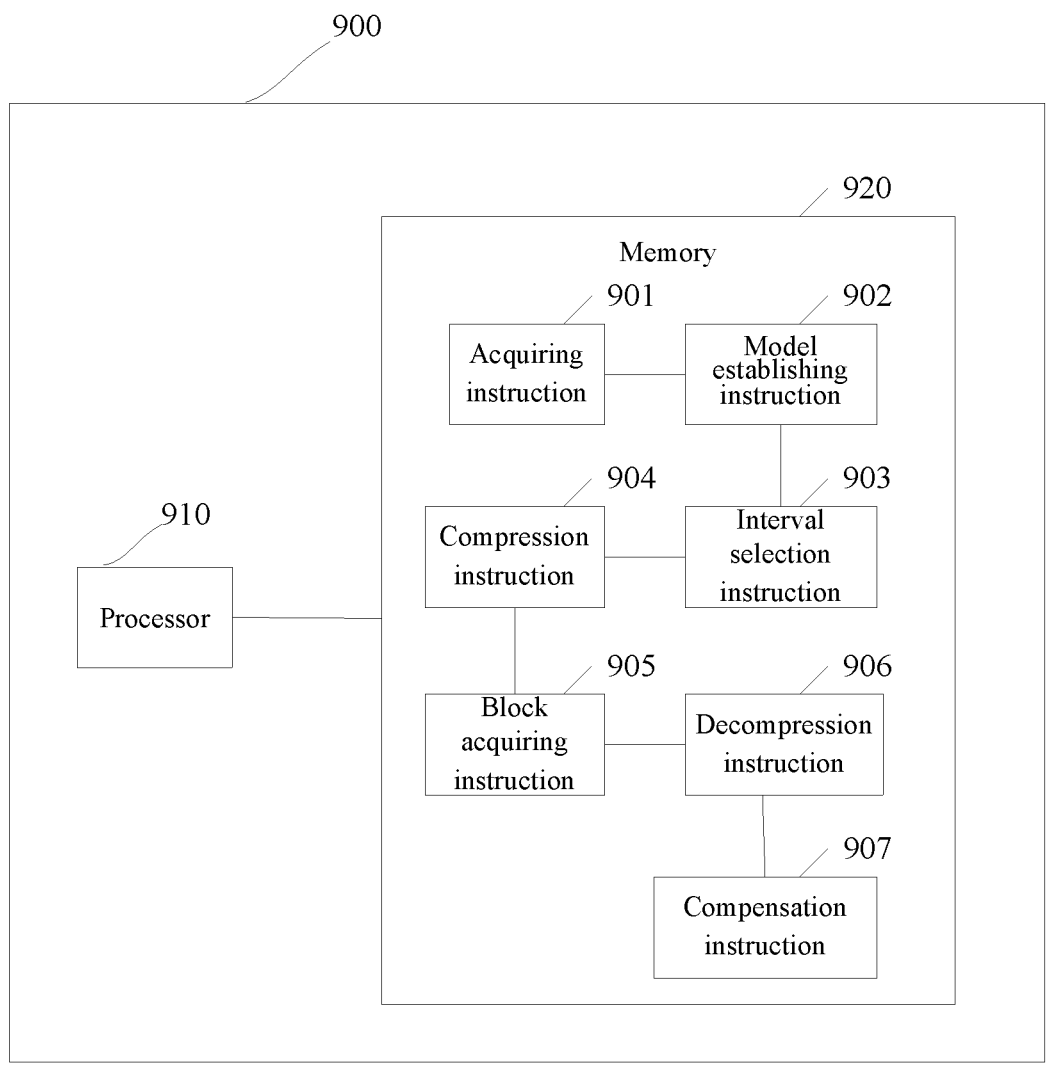
FIG. 19 is a schematic diagram of a specific configuration of an apparatus for compensating for driving in an embodiment of the present disclosure.

FIG. 19 is a schematic diagram of a specific configuration of an apparatus for compensating for driving in an embodiment of the present disclosure. As illustrated in FIG. 19, the apparatus 900 for compensating for driving comprises a memory 920 and a processor 910. The memory 920 is configured to store an acquiring instruction 901, a model establishing instruction 902, an interval selection instruction 903, a compressing instruction 904, a block acquiring instruction 905, a decompressing instruction 906, and a compensating instruction 907.

The processor 910 is configured to communicate with the memory 920, execute the acquiring instruction 901, the model establishing instruction 902, the interval selection instruction 903, the compressing instruction 904, the block acquiring instruction 905, the decompressing instruction 906, and the compensating instruction 907, so as to execute the operations of the acquiring module 601, the module establishing module 602, the interval selection module 603, the decompression module 604, the block acquiring module 605, the decompressing block 606, and the compensation module 607 described above, respectively.

The above described merely are specific implementations of the present disclosure, but the protection scope of the present disclosure is not limited thereto, modification and replacements which easily occur to those skilled in the art within the technical range revealed by the present disclosure all fall into the protection scope of the present disclosure. Therefore, the protection scope of the present disclosure is based on the protection scope of the claims.

What is claimed is:

1. A method for compressing data information, comprising:
    acquiring data information corresponding to each of sub-pixel units in a display device, the data information representing a luminance capability of the sub-pixel unit;
    establishing a distribution function model of data information based on the data information of the sub-pixel units in the display device;
    obtaining an effective value selection interval based on the distribution function model and a preset effective threshold, the preset effective threshold being preset to choose the effective value selection interval on the distribution function model, and the effective value selection interval being an interval where the data information of the sub-pixel units is mainly distributed; and
    dividing the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, 0<M<1/N.

2. The method of claim 1, wherein establishing the distribution function model based on the data information comprises:
    performing a calculation based on the data information to obtain distribution function parameters; and
    establishing the distribution function model based on the distribution function parameters.

3. The method of claim 1, wherein obtaining an effective value selection interval based on the distribution function model and the preset effective threshold comprises:
    taking an interval where the data information within an effective threshold range resides in the distribution function model as the effective value selection interval; and
    setting the data information outside the effective threshold range in the distribution function model as being located at a boundary of the effective value selection interval.

4. The method of claim 1, wherein $M = (\log_2 N)/(N*P)$.

5. The method of claim 1, wherein boundary values of the effective value selection interval are X1 and X2, respectively;
    after dividing the effective value selection interval into N compression sections, the method further comprises:
    calculating a quantization value C(i) corresponding to each of the compression sections by using a formula $C(i) = X1 + [(2i-1)/2N]*(X2-X1)$ based on the boundary values X1 and X2 of the effective value selection and the N, wherein X1<X2, i is a positive integer and $1 \leq i \leq N$; and
    marking each of the compression sections by using the quantization value C(i) corresponding to each of the compression sections.

6. The method of claim 5, wherein after marking each of the compression sections by using the quantization value C(i) corresponding to each of the compression sections, the method further comprises:
    encoding each of the compression sections to obtain an address code for each of the compression sections; and
    establishing a correspondence between the address code and the quantization value C(i).

7. A method for compensating for driving, comprising:
    compressing data information according to claim 1;
    acquiring N compressed data information blocks, each of the compressed data information blocks including multiple pieces of data information, and each of the compressed data information blocks corresponding to one compression section, N being a positive integer; and
    decompressing each of the compressed data information blocks, wherein each of the compressed data information blocks is decompressed to 1/M times of a size of each of the compressed data information blocks, and a storage length of the data information obtained by decompression is P, 0<M<1/N; and
    acquiring the decompressed data information, and compensating for the sub-pixel unit corresponding to the data information based on the data information.

8. An apparatus for performing the method of claim 7, comprising:
    an acquiring module configured to acquire data information corresponding to each sub-pixel unit, the data information representing a luminance capability of the sub-pixel unit;
    a model establishing module configured to establish a distribution function model based on the data information;
    an interval selection module configured to obtain an effective value selection interval based on the distribution function model and a preset effective threshold;

a compression module configured to divide the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, 0<M<1/N;

a block acquiring module configured to acquire N compressed data information blocks, each of the compressed data information blocks including multiple pieces of data information, and each of the compressed data information blocks corresponding to one compression section;

a decompression module configured to decompress each of the compressed data information blocks, wherein each of the compressed data information blocks is decompressed to 1/M times of a size of each of the compressed data information blocks; and a compensation module configured to acquire the decompressed data information, and to compensate for the sub-pixel unit corresponding to the data information based on the data information.

9. A display device, comprising the apparatus of claim 8.

10. An apparatus for performing the method of claim 1, comprising:

an acquiring module configured to acquire data information corresponding to each sub-pixel unit, the data information representing a luminance capability of the sub-pixel unit;

a model establishing module configured to establish a distribution function model based on the data information;

an interval selection module configured to obtain an effective value selection interval based on the distribution function model and a preset effective threshold; and a compression module configured to divide the effective value selection interval into N compression sections, compressing data information corresponding to each of the compression sections into M times of a total size of data information corresponding to all sub-pixel units based on a storage length P of the data information corresponding to each sub-pixel unit, thus obtaining N compressed data information blocks, N being a positive integer, 0<M<1/N.

11. The apparatus of claim 10, wherein the model establishing module comprises:

a calculating unit configured to perform an calculation based on the data information to obtain distribution function parameters; and an establishing unit configured to establish the distribution function model based on the distribution function parameters.

12. The apparatus of claim 10, wherein the interval selection module comprises:

a first interval selection unit configured to take an interval where the data information within the effective threshold range resides in the distribution function model as the effective value selection interval;

a second interval selection unit configured to set the data information outside the effective threshold range in the distribution function model as being located at a boundary of the effective value selection interval.

13. The apparatus of claim 10, wherein $M=(\log_2 N)/(N*P)$.

14. The apparatus of claim 10, wherein boundary values of the effective value selection interval are X1 and X2, respectively;

the apparatus for compressing data information further comprises:

a quantization module configured to calculate a quantization value C(i) corresponding to each of the compression sections by using a formula $C(i)=X1+[(2i-1)/2N]*(X2-X1)$ based on the boundary values X1 and X2 of the effective value selection interval as well as the N, X1<X2, i being a positive integer and $1 \leq i \leq N$; and a marking module configured to mark each of the compression sections by using the quantization value C(i) corresponding to each of the compression sections.

15. The apparatus of claim 14, further comprising:

an encoding module configured to encode each of the compression sections to obtain an address code for each of the compression sections; and a relationship establishing module configured to establish correspondence between the address code and the quantization value C(i).

16. A method for decompressing data information, comprising:

acquiring N compressed data information blocks, each of the compressed data information blocks including multiple pieces of data information, and each of the compressed data information blocks corresponding to one compression section, N being a positive integer, each piece of data information corresponding to one of sub-pixel units in a display device and representing a luminance capability of the sub-pixel unit;

decompressing each of the compressed data information blocks, wherein each of the compressed data information blocks is decompressed to 1/M times of a size of each of the compressed data information blocks, 0<M<1/N; and acquiring data information corresponding to each of sub-pixel units in the display device for display based on the decompressed data information, a storage length of the data information corresponding to each sub-pixel unit is P.

17. The method of claim 16, wherein $M=(\log_2 N)/(N*P)$.

18. The method of claim 16, wherein prior to acquiring N compressed data information blocks, the method further comprises:

obtaining an address code, and looking up a quantization value C(i) corresponding to the address code based on the address code as well as correspondence between the address code and the quantization value C(i);

looking up a compression section corresponding to the quantization value C(i) based on the quantization value C(i) corresponding to the address code as well as correspondence between the quantization value C(i) and the compression section; and looking up a compressed data information block corresponding to the compression section, based on the compression section corresponding to the quantization value C(i) as well as correspondence between the compression section and the compressed data information block.

19. An apparatus for performing the method of claim 16, comprising:

a block acquiring module configured to acquire N compressed data information blocks, each of the compressed data information blocks including multiple pieces of data information, and each of the compressed data information blocks corresponding to one compression section, N being a positive integer;

a decompression module configured to decompress each of the compressed data information blocks, wherein each of the compressed data information blocks is decompressed to 1/M times of a size of each of the compressed data information blocks, a storage length of the data information obtained by decompression being P, 0<M<1/N.

* * * * *